United States Patent [19]

Boot

[11] Patent Number: 6,097,523
[45] Date of Patent: Aug. 1, 2000

[54] OPTICAL SYSTEMS WITH ONE OR MORE STABILIZED LASER SIGNAL SOURCES

[75] Inventor: Adriaan Johan Boot, Zoetermeer, Netherlands

[73] Assignee: Koninklijke KPN N.V., Groningen, Netherlands

[21] Appl. No.: 08/980,015

[22] Filed: Nov. 26, 1997

[30] Foreign Application Priority Data

Dec. 2, 1996 [NL] Netherlands ............................. 1004667

[51] Int. Cl.[7] .................................................. H04B 10/00
[52] U.S. Cl. ......................... 359/168; 359/125; 359/111; 359/110; 359/167
[58] Field of Search .................................... 359/125, 127, 359/133, 110–111, 168, 167; 372/29

[56] References Cited

U.S. PATENT DOCUMENTS

| 4,635,246 | 1/1987 | Taylor et al. | 372/18 |
| 5,401,955 | 3/1995 | Van Den Brink | 250/227.11 |
| 5,598,288 | 1/1997 | Collar | 359/111 |
| 5,892,607 | 4/1999 | Atlas | 359/183 |

FOREIGN PATENT DOCUMENTS

| 0386466 | 9/1990 | European Pat. Off. . |
| 0386482 | 9/1990 | European Pat. Off. . |
| 0503579 | 9/1992 | European Pat. Off. . |
| 0564098 | 10/1993 | European Pat. Off. . |
| 0708540 | 4/1996 | European Pat. Off. . |
| 4214375 | 11/1993 | Germany . |

OTHER PUBLICATIONS

Finn Mogensen, et al. "Locking Conditions and Stability Properties for a Semiconductor Laser with External Light Injection", IEEE Journal of Quantum Electronics, vol. QE–21, No. 7, Jul. 1985, pp. 784–793.

M.. R.. Surette, et al.: "Effects of Noise on Transients of Injection Locked Semiconductor Lasers", IEEE Journal of Quantum Electronics, vol. 29, No. 4, Apr. 1993, pp. 1046–1062.

*Primary Examiner*—Kinfe-Michael Negash
*Attorney, Agent, or Firm*—Oblon, Spivak, McClelland, Maier & Neustadt, P.C.

[57] ABSTRACT

Optical stabilization system having a signal source (1) connected to a transmission line (2) and a noise source (3). The signal source (1) comprises a laser having a number of laser modes within a first wavelength band for generating an optical transmission signal (S). The noise source generates a narrow-band noise signal which is inserted into the transmission line via coupling means (5) and is injected into the laser of the signal source (1). The noise signal forces the laser to operate in a laser mode within the noise band. Via a power distributor (11), a portion of the noise signal can also be injected into a laser of a further signal source (9) for stabilization in a laser mode within the same noise band. Any signals outside the noise band are removed from the transmission signal by a narrow-band filter (8). The stabilization system is applied in passive optical networks for groupwise wavelength assignment to network terminals.

20 Claims, 3 Drawing Sheets

OPTICAL SYSTEMS WITH ONE OR MORE STABILIZED LASER SIGNAL SOURCES

A. BACKGROUND OF THE INVENTION

1. Field of the Invention

The invention lies in the field of optical systems having one or more laser signal sources. More in particular, it relates to an optical system for tuning and maintaining the tuning, hereinafter referred to as stabilising, of one or more laser signal sources to a desired wave length by means of an injected optical signal. It relates further to an optical signal transmission system having a passive optical network (PON) provided with such a system for stabilising laser signal sources in network terminals of the network.

2. Prior Art

Developments are moving ever more in a direction in which local connection networks for public telecommunication services, such as telephony, are implemented as passive optical networks. Such networks form therein optical line connections between a main station (telecommunication switch) and a large number (for example 2000 or more) of network terminals for users of said services. The signal communication over such networks takes place upstream per group of connected users often at a same optical wavelength, a further differentiation to the individual user being obtained by an additional channel division, such as time division (TDM), frequency division (FDM), etc. Such networks are known, for example, from References [1] and [2] (for bibliographical details relating to the references, see hereinafter under C). Further, such a network, in which the upstream signal communication takes place on wavelength division basis (WDM), each user or group of users working at a wavelength which is specific for a user or a group of users, is known from Reference [3]. Such networks are preferably dimensioned for as large a number of network terminals as possible, an effective transmission capacity per user being offered which is as high as possible at the lowest possible costs per user. To this end the total number of network terminals is partitioned, i.e. divided into a number of groups or partitions, each group being allocated one of the number of wavelengths available for WDM. This means that each user within a group must have transmission equipment at his/her disposal which is suitable for transmitting at the wavelength allocated to the group. Problems in that respect are that transmission equipment with tuneable lasers is expensive, and that the application of lasers which must be selected for a fixed wavelength range which is specific for a group is not only expensive but also renders the network less flexible.

Another problem is that, in order to retain still detectable signals for a reliable reception in a passive optical network having a high degree of splitting out, signal amplifiers must be included at suitable points in the network. In order to limit the noise of the signal amplifiers in such a network, optical filters are also necessary. Overall, it holds true that the sensitivity of the network increases as the bandwidth of such filters is able to be chosen more narrow, and that as a result the number of users can be greater. For the upstream signal communication over such public networks, the connected users must have at their disposal transmission equipment having an optical signal capable of modulation, which is preferably generated by a relatively simple and cheap signal source. A signal source qualifying for this is, for example, a non-tuneable Fabry-Perot laser (FP laser) which operates at a wavelength around 1300 nm. Such an FP laser has the property that it possesses a number of different laser modes, each having its own wavelength within a certain wavelength band, in which it can operate. If the laser starts operating, however, the laser mode it will assume cannot be determined beforehand. The width of the wavelength band, which lies in the order of 20–55 nm, is relatively wide. Such FP lasers can therefore not be used merely in combination with narrow-band amplifiers or filters having a width of, for example, 20 to 30 nm. Furthermore, it is customary that all network terminals connected to the tree-shaped branched network of a PON, or to a tree-shaped branched part thereof, transmit at a same wavelength, at least within certain ranges of accuracy. This means that if non-selected, non-tuneable semiconductor lasers are used as signal source, a possibility must be present for tuning all these laser signal sources to the desired same transmission wavelength and keeping them tuned, i.e. stabilising them.

Optical systems are known for stabilising the wavelength of a laser signal source, such as, for example, from the References [4] and [5], which are based on a technique referred to by the term "injection locking". According to this technique, a semiconductor laser can be forced to operate in a laser mode at a desired frequency (wavelength). In this case, an external optical signal, originating from a laser signal source stabilised for a specific laser mode, called master laser, is injected into the laser cavity of a freely oscillating laser signal source, called a slave laser. If the frequency of the injected optical signal lies sufficiently close to a characteristic frequency of the slave laser, the latter will stabilise itself at the frequency of the injected signal and with a fixed relative phase with respect to the phase of the injected signal. The technique of injection locking, however, requires that the characteristic frequency of a slave laser which is to be stabilised lies within a very narrow frequency band, the locking bandwidth, around the frequency of the injected signal. This technique is in general therefore hardly or not at all suitable for stabilising two or more slave lasers simultaneously, let alone for stabilising the cheap lasers mentioned above, which are manufactured with wide tolerances. A master laser further requires optimal and well-stabilised operating conditions, such as environmental temperature control. Above a certain number of slave lasers, the optical signal originating from the master laser will furthermore need to be amplified, which is accompanied by an additional noise signal that in turn can adversely effect the stabilisation of a slave laser, as described, for example, in the Reference [5] already mentioned above.

It can be concluded, therefore, that there is a need for a technique for stabilising one or more laser signal sources at laser wavelengths within a limited wavelength band, which upon application in passive optical networks permits the use of cheap non-tuneable laser signal sources and of narrow-band amplifiers, and which, in a simple manner, allows partitioning, that is to say, wavelength allocation and stabilisation per group of network terminals, to be performed from the network.

B. SUMMARY OF THE INVENTION

The object of the invention is to provide for the aforementioned need. Said invention is based on the fact that experiments have shown that if a narrow-band, noise-shaped optical signal with a given intensity and a given wavelength band, called noise band, is injected into the laser cavity of an oscillating laser, and this laser possesses at least one laser mode within the gain bandwidth of the laser with a characteristic wavelength within or up to a certain distance (indicatively $\geq 20$ nm) outside the noise band of the injected noise signal, the laser will start and/or remain oscillating at a wavelength within the noise band. In this event there are two different possibilities, dependent upon the wavelength distance between the noise band and the characteristic wavelength of the laser mode. Within a certain wavelength distance (indicatively 10 nm), the laser mode transfers itself to a wavelength within the noise band. Outside the said wavelength distance, the laser mode continues to exist at the characteristic wavelength, although an additional laser mode having a wavelength within the noise band also arises. In both cases, the injected noise signal is amplified, as it were. This amplified noise signal is capable of being modulated in the same manner as the signal of the original laser mode without injection of the noise signal, and is of sufficient intensity to be usable as optical signal for data transmission purposes. In the second case, the signal corresponding to the original laser mode can be filtered out by means of a narrow-band filter corresponding to the noise band.

An optical system for generating and transmitting a stabilised optical transmission signal is known from References [4] and [5]. If the gain bandwidth of the laser of the first signal source is relatively wide (for example 55 nm), with a relatively large number of possible laser modes within the gain bandwidth (for example 70), the noise band can be chosen to be narrow (with the lower limit as mode separator). If the laser possesses more than one laser mode with a characteristic wavelength within the noise band, then it is true that it cannot be determined in advance which of the laser modes will be adopted. It is certain, however, that the characteristic wavelength of the laser mode concerned is always located within the noise band, which can be chosen to be narrow if desired.

In a preferred embodiment, the system comprises at least one further optical signal source of a same kind as the first signal source, in which the noise source is also coupled, via a further optical transmission line branched off over splitting means of the optical transmission line, to the further signal source for injecting the noise signal in the laser of the further signal source.

Optical signal sources for generating narrow-band noise-shaped signals are known per se, such as for example from References [6] and [7], and shall therefore not be further described here.

It should be observed that, within the framework of the invention, the concept of noise source must be broadly interpreted. In this context, an optical laser which is tuneable according to wavelength, and which emits a noise-like signal occurring when the central wavelength of the laser is swept between two limiting values, is also considered to be a noise source. In that case, said limiting values determine (the width of) the noise band. A requirement in that event is that the sweep frequency is much greater than a possible bit rate which is applied to modulate the optical signal, generated by the laser, in which the noise-like signal is injected.

From Reference [8], a method and a device are known for increasing the line width of a laser signal by injecting a noise-shaped optical signal in the laser cavity of a laser signal source based on an EDFA. The noise-shaped signal is spontaneous emission at or near the wavelength of the laser mode of the laser cavity.

In optical signal transmission systems which are based on a passive optical network, the optical system according to the invention makes it possible to equip the connection nodes (such as, for example, Optical Network Units (ONUs)) with identical non-tuneable lasers and to let these operate, partitioned or not, at the same wavelength.

From Reference [9] a passive optical network with WDM is known, in which upstream and downstream a wavelength-divided routing is achieved by a bidirectional application of spectral slicing in a WDM/R coupling in combination with LEDs as relatively wide-banded, non-tuneable optical signal sources. A restriction of this known technique is that the signal power per slice is very limited. By applying spectral slicing in such a WDM/R coupling in combination with a relatively wide-banded signal source, however, a number of noise signals having small disjoint noise bands can be obtained. According to the principle of the invention, said noise signals can be inserted into different sub-trees of a PON and distributed for the purpose of stabilising laser signal sources in each group of network terminals connected to a related sub-tree.

C. REFERENCES

[1] EP-A-0386466;
[2] EP-A-0382482;
[3] DE-A-4214375;
[4] F. Mogensen, et al.: "Locking conditions and stability properties for a semiconductor laser with external light injection", IEEE Journal of Quantum Electronics, Vol. QE-21, No. 7, July 1985, pp. 784–793;
[5] M. R. Surette, et al.: "Effects of noise on transients of injection locked semiconductor lasers", IEEE Journal of Quantum Electronics, Vol. 29, No. 4, April 1993, pp. 1046–1062;
[6] EP-A-0564098;
[7] U.S. Pat. No. 5,401,955;
[8] EP-A-0503579;
[9] EP-A-0708540.

All references are deemed to be incorporated in the present application.

D. BRIEF DESCRIPTION OF THE DRAWING

The invention will be further explained by means of a description of exemplary embodiments, reference being made to a drawing which comprises the following figures:

FIG. 1 diagrammatically shows an embodiment of the system according to the invention;

FIG. 2 with parts (a), (b) and (c) diagrammatically shows a laser mode of a laser signal source applied in the implementation of FIG. 1 at a characteristic wavelength without injection of a noise signal (part (a)), and at a laser wavelength determined by an injected noise signal having a first wavelength band (part (b)) and having a second wavelength band (part (c));

Figure 1:
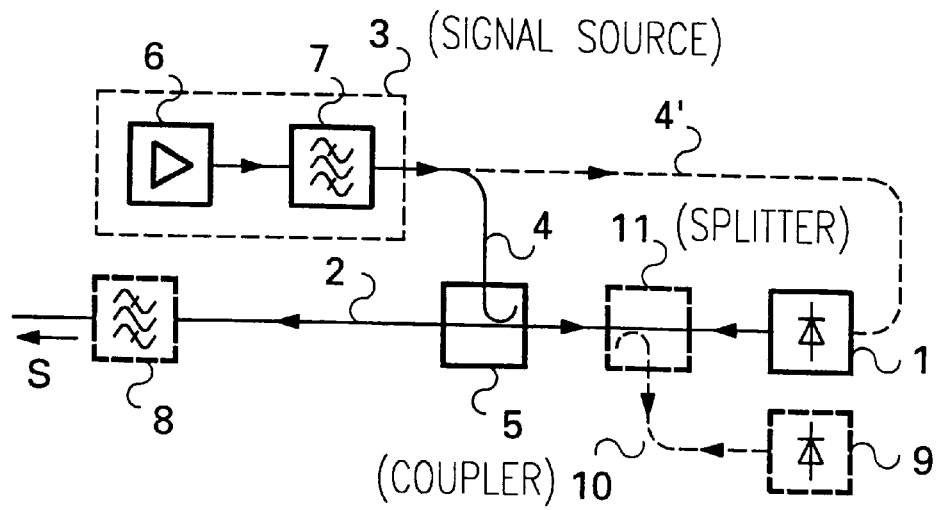
Figure 5:
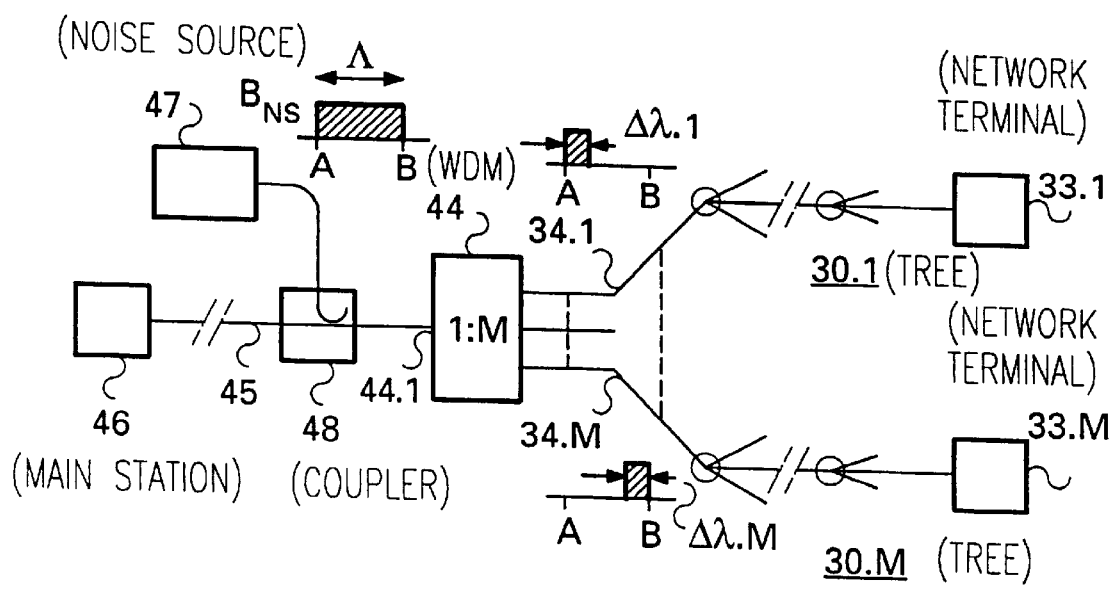
FIG. 5 shows a passive optical network in which the invention is applied, according to a third variant.
Figure 6:
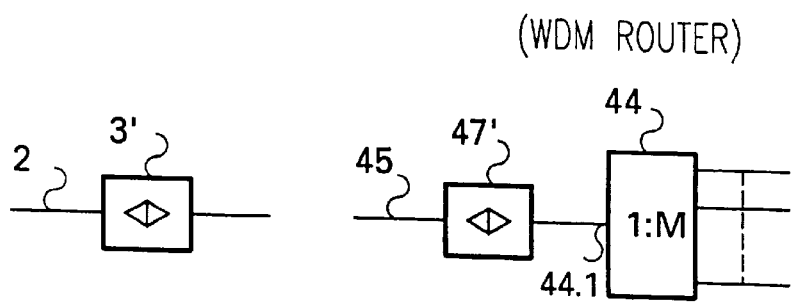

FIG. 6 diagrammatically shows the application of a bidirectional optical amplifier as noise source, in part (a) for the implementation of FIG. 1, and in part (b) for the network according to FIG. 5.

E. DESCRIPTION OF EXEMPLARY EMBODIMENTS

Figure 2:
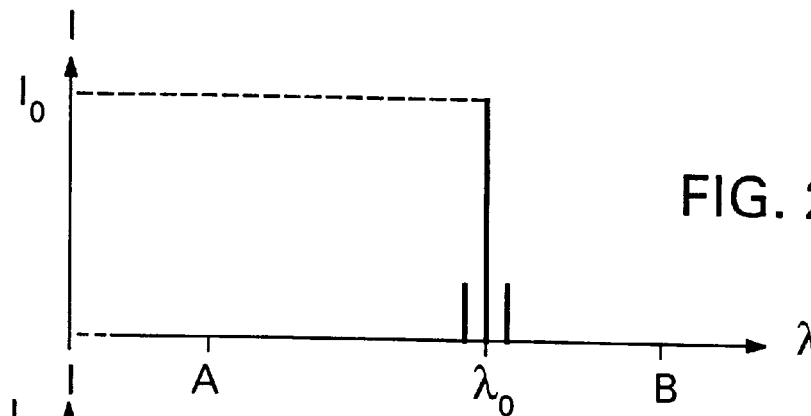
Figure 2:
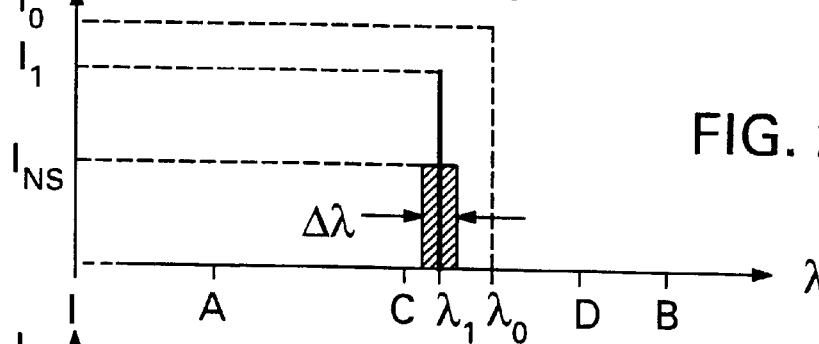
Figure 2:
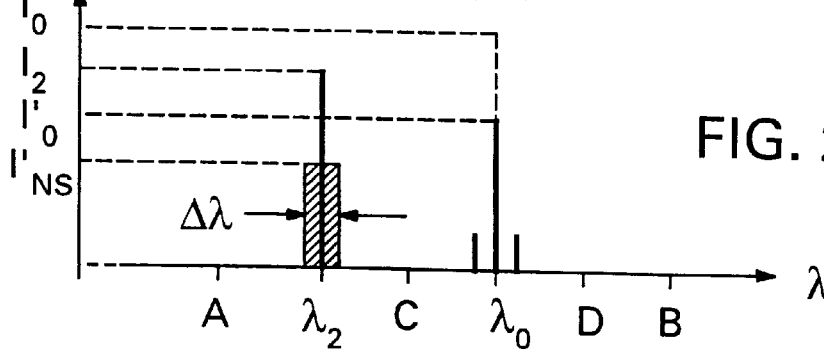

FIG. 1 diagrammatically shows the optical system according to the invention in its most elementary embodiment. The system comprises an optical laser 1, which is connected to an optical transmission line 2, such as an optical fibre connection. The system further comprises an optical signal source 3 for generating a narrow-band noise signal NS, which, via an optical connection 4 and an optical power coupler 5 included in the transmission line 2, is inserted into the transmission line 2 in the direction of the optical laser 1 and is injected into the laser cavity of said laser 1. In said figure, an alternative optical connection 4' is also shown, via which the noise signal can be injected into the laser cavity of the laser at the opposite end, all this dependent upon the type of the laser. The laser is of a non-tuneable type, such as for example a simple FP laser, which possesses at least one laser mode having a characteristic wavelength within the bandwidth [A, B] of the gain curve of said laser type. Without injection of a noise signal, a laser of said type will start oscillating in a laser mode having, for example, a characteristic wavelength $\lambda_0$ within the band [A, B], and at an intensity $I_0$, which is determined by the height of the gain curve at the point of the characteristic wavelength of the laser mode. This situation is diagrammatically shown in part (a) of FIG. 2. Another specimen of the same type of laser will also oscillate in a laser mode having a characteristic wavelength within the band [A, B], but it can not be determined beforehand at which characteristic wavelength. Experimentally it has been shown that if a narrow-band noise signal NS having a bandwidth $\Delta\lambda$ around a wavelength $\lambda_1$ and an intensity $I_{NS}$ within a sub-band [C, D] of the band [A, B] is injected into the laser, the laser will start oscillating in a laser mode having a wavelength $\lambda_1$ and an intensity $I_1$. This situation is diagrammatically shown in part (b) of FIG. 2. If the noise signal NS lies around a wavelength $\lambda_2$ outside the sub-band [C, D], however, the laser will remain oscillating in the laser mode having the characteristic wavelength $\lambda_0$ and having an intensity $I_0'$, but the laser will also start oscillating in the laser mode having the characteristic wavelength $\lambda_2$ and having an intensity $I_2$. This situation is diagrammatically shown in part (c) of FIG. 2.

In the experimental set-up, a noise source was used which was composed of an optical amplifier 6 and a tuneable, narrow-band Fabry-Perot filter (FP filter) 7. The laser was a non-tuneable semiconductor laser of the type Fabry-Perot (FP laser) (manufactured by BT&D Technologies, code LSC 3100), which operated in a laser mode having a characteristic wavelength $\lambda_L$=1296 nm. The optical amplifier generated ASE noise having a bandwidth of 60 nm in the 1300 nm window, which was filtered in the FP filter to a noise signal having a bandwidth of 2 nm. The noise signal was injected into the FP laser via the power coupler. The laser's output signal S was analysed with an OSA (Optical Spectrum Analyser). The total optical power of the filtered noise was adjusted to approx. 5 dBm at the input of the FP laser. During the measurements it was found that, upon displacement of the noise band, the wavelength ($\lambda_1$) of the laser mode could be tuned to within 5 nm at both sides of the original characteristic wavelength $\lambda_0$ (at an intensity of $I_1 \approx \frac{3}{4} I_0$). Outside that, the original laser mode (wavelength $\lambda_0$) was maintained, be it with an intensity that was approximately one half lower ($I_0'$), although a second laser mode also occurred at a wavelength $\lambda_2$ (at an intensity $I_2 \approx \frac{3}{4} I_0$). Evidently, an amplification of the noise signal occurs, where, dependent upon the distance of the central wavelength of the noise signal to the characteristic wavelength of the original laser mode, the laser will or will not also remain operating in the original laser mode, be it at a lower intensity. The amplification of the noise signal does not only occur when the laser operates above the threshold, but also below it.

This means that, by injection of a noise signal having a specific noise band (minimally greater than the mode separation, and preferably one and a half to twice the size of the mode separation) originating from a tuneable noise source, a per se non-tuneable laser can, as it were, always be forced to operate in a laser mode having a wavelength which is approximately equal to the central wavelength of the noise band. In effect, the laser concerned becomes therewith a tuneable signal source which can emit a signal at a wavelength within the noise band which is more stable to the degree in which the noise signal can be injected into the laser in a more stable manner. By including a narrow-band optical filter 8 having a pass band which corresponds to the noise band in the transmission line 2 upstream of the power coupler 5, it can be achieved that the signal, which is possibly present, of the original laser mode outside the noise band of the injected noise signal is filtered out from the transmission signal S.

Although noise signal amplification was only experimentally shown for an FP-type semiconductor laser, the principle is such that it will also be able to be applied for other types of lasers, such as the DBR laser and the DBF laser.

Via one or more power splitters, noise signal can also be conducted to other lasers for injection. In FIG. 1, this is shown for a further laser 9, which, via an optical connection 10, is thereto connected to a power coupler/splitter 11 included in the transmission line 2 between the power coupler 5 and the laser 1. Thus a plurality of such lasers may be stabilised, i.e. be forced to operate, at laser modes within the same narrow wavelength band simultaneously, by injecting the same specific external optical signal in each laser of the plurality of lasers.

More generally, this can be applied in a passive optical network (PON) for partitioning purposes. Such a network connects via a tree-shaped branched system of optical (often fibre) connections a large number of network terminals (such as ONUs) optically with a main station. If the network terminals are provided with a same type of non-tuneable laser as optical signal source, then said lasers can be forced, all or per group, to operate from the network at a same signal wavelength. At a main extremity of the tree-shaped branched system, or of a tree-shaped branched part of the system, noise signal of sufficient strength is thereto inserted in the direction of the network terminals connected to the system or to the related part of the system. The noise signal is distributed in the system, or in the related part of the system, and ultimately injected into the lasers of the network terminals connected thereto. Three different embodiments hereof are described hereinafter with reference to FIG. 3, FIG. 4 and FIG. 5.

Figure 3:
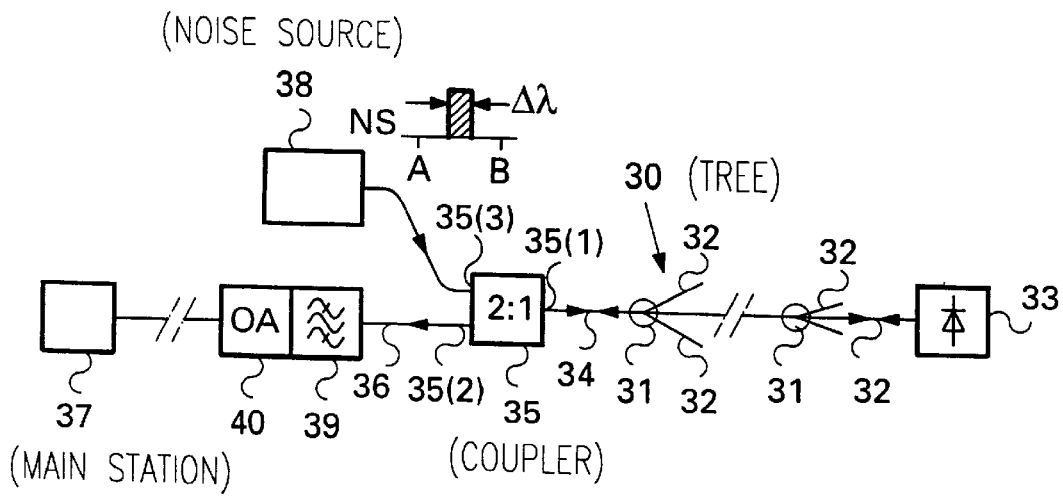
FIG. 3 shows a (passive) optical network in which the invention is applied, according to a first variant.

FIG. 3 diagrammatically shows a PON having a single tree structuur 30, hereinafter referred to as tree. The tree 30 has branchings 31 provided with branches 32 terminated with network terminals 33 (for the sake of simplicity, only one is drawn in the figure), which are all provided with a same type of optical transmission laser. A main extremity 34 of the tree is coupled to a first port 35.1 of a power coupler 35. An offshoot 36 which is connected to a second port 35.2 of the power coupler connects the tree upstream to a main station 37, which is provided with an optical receiver (not shown). A narrow-band noise source 38 is connected to a third port 35.3 of the power coupler 35. The noise source generates a narrow-band noise signal NS having a noise band $\Delta\lambda$ within the gain bandwidth [A, B] of the laser type applied in the network terminals. The noise signal NS is inserted and distributed via the power coupler 35 in the tree 30. The distributed noise signal is injected into the lasers of the network terminals for stabilising the lasers at a transmission wavelength within the noise band $\Delta\lambda$ of the noise signal NS. In the offshoot 36, an optical narrow-band filter 39 is included, of which the pass band corresponds to the noise band of the noise signal NS, if necessary combined with an optical amplifier 40.

Figure 4:
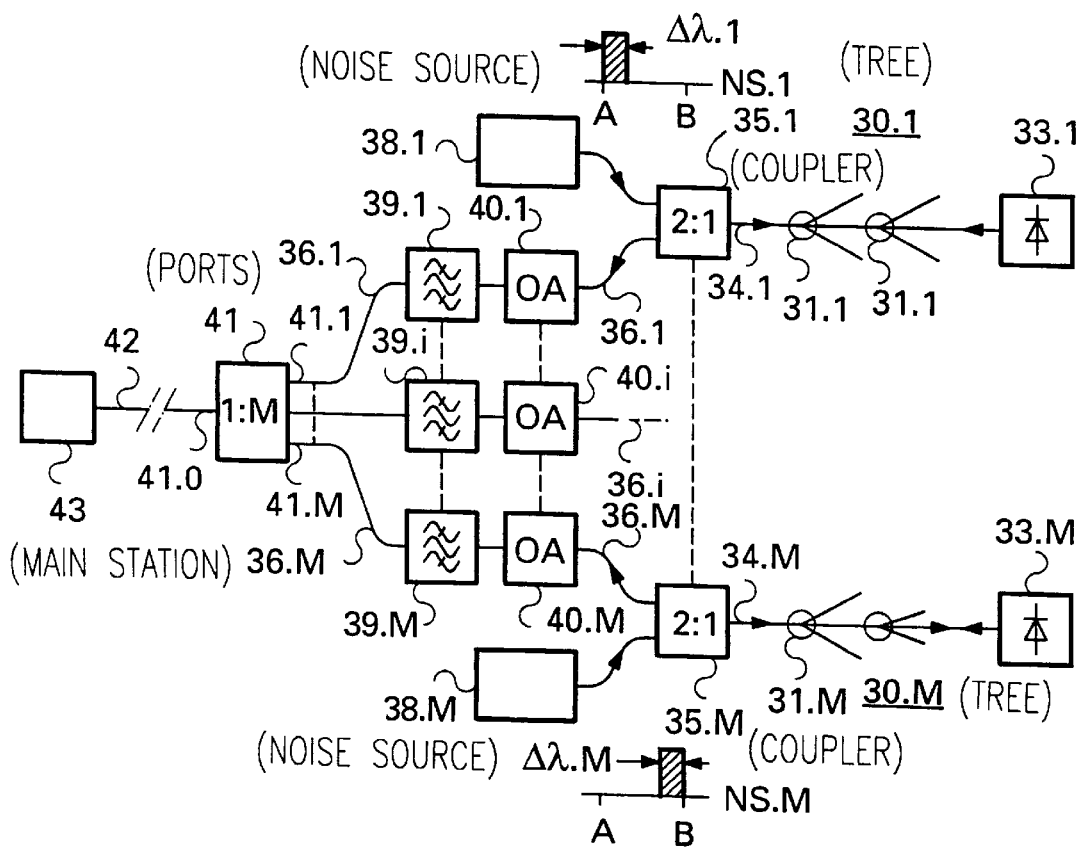
FIG. 4 shows a (passive) optical network in which the invention is applied, according to a second variant.

FIG. 4 shows a PON having a multiple tree structure. Said PON comprises an M number of network parts having a same structure as shown in FIG. 3. It comprises an M number of tree-shaped branched parts 30.1, . . . , 30.M, referred to as sub-trees, having M groups of network terminals 33.1, . . . , 33.M and equal numbers of power couplers 35.1, . . . , 35.M, offshoots 36.1, . . . , 36.M, and noise sources 38.1, . . . , 38.M of a same kind as shown in FIG. 3. The noise sources 38.1, . . . , 38.M generate narrow-band noise signals NS.1, . . . , NS.M having mutually disjoint noise bands $\Delta\lambda.1$, . . . , $\Delta\lambda.M$. Narrow-band optical filters 39.1, . . . , 39.M and optical amplifiers 40.1, . . . , 40.M are included in the offshoots. Each filter 39.i (where i=1, 2, . . . , M) has a pass band which corresponds to the noise band $\Delta\lambda.i$ of the related noise source 38.i. The offshoots 36.1, . . . , 36.M are coupled one by one to the M input ports 41.1, . . . , 41.M of a wavelength multiplexer 41. The output port 41.0 is connected to a main station 43 via an optical transmission line 42. Signals transmitted upstream in the trees and offshoots are multiplexed in the wavelength multiplexer 41, and further transmitted to the main station 43 as a multiplexed signal over the transmission line 42. For further signal processing, the main station will need to be provided with a demultiplexer (not shown). In this second embodiment, a passive power coupler/splitter can be applied instead of the wavelength multiplexer 41.

Instead of M different noise sources, which can be placed at a geographical distance from each other as required, one noise source can suffice by applying a wavelength division multiplexing router (WDM/R) known per se having 1×M (bidirectional) ports (see Reference [9]). Such a router, hereinafter referred to as WDM-router, divides a (relatively) wide-banded optical signal entering via one port into M narrow spectral slices, and puts each slice in a distinct port of the M ports as output signal. In this way, a noise band corresponding to a part or even the whole of the gain bandwidth [A, B] of the type of laser applied can be divided into narrow spectral slices forming M small disjoint noise bands $\Delta\lambda.i$. By connecting a similar tree as tree 30 (FIG. 3) to each of the M ports, the lasers of M groups of the network terminals connected to the M trees can be provided with a noise signal for tuning and stabilisation at a wavelength within the related small noise band, in the same manner as in the embodiment according to FIG. 4. In FIG. 5, a PON is diagrammatically shown in which such a router is applied. The main extremities 34.1, . . . , 34.M of the M trees 30.1, . . . , 30.M are connected one by one (if required via an optical amplifier, not shown) to the M ports of a WDM router 44 having 1×M ports. A port 44.1 of the WDM router is connected to a main station 46 via an optical transmission line 45. An optical noise source 47 generates a noise signal $B_{NS}$ which, via a power coupler 48, is inserted into the transmission line 45 in the direction of the WDM router. The noise signal $B_{NS}$ generated by the noise source 47 has a relatively wide noise band $\Lambda$ which only by way of example encompasses the whole gain bandwidth [A, B] of the type of laser applied, but can be chosen smaller if required. In the WDM router 44, the noise band $\Lambda$ of the noise signal is divided into M slices, the M small noise bands $\Delta\lambda.1$, . . . , $\Delta\lambda.M$. The noise signals corresponding to said small noise bands are subsequently distributed over the M trees. The transmission signals transmitted upstream from the network terminals are multiplexed again in the WDM router 44 and transported to the main station 46 via the transmission line 45. In the WDM router 44 the signals which are transmitted upstream are also filtered from the signals which are present outside the small noise bands, so that in principle no extra narrow-band filters having the small noise bands as pass band need to be added in this embodiment.

In the embodiments described, it was assumed that each noise source is provided with an insulator to prevent transmission signals which are transmitted upstream from ending up in the noise sources. Such an insulator is not necessary if the power coupler 4 (FIG. 1) or the power splitters 35 (in FIG. 3 and FIG. 4) are replaced by optical circulators.

Optical amplifiers such as type EDFA or SOA (semiconductor optical amplifier) already produce noise of sufficient intensity per se. A bidirectional optical amplifier of such a type having the desired noise band can therefore serve as noise source, with the advantage that it can be directly included in the related transmission line. This is diagrammatically shown in FIG. 6. In part (a) this is shown for the narrow band embodiment of FIG. 1, in which a bidirectional optical amplifier 3' having the same noise band as noise source 3 is included in the transmission line 2. Narrow-band amplifiers of the same kind can be applied in a corresponding manner in the embodiments of FIG. 3 and FIG. 4. Part (b) of FIG. 6 shows this for the relatively wide-banded embodiment of FIG. 5, in which a bidirectional optical amplifier 47' is included in the transmission line 45 before the port 44.1 of the WDM router 44.

Assuming a power for the noise signal of approx. 5 dBm, which proved to be sufficient for stabilising a laser experimentally, a noise source having a signal power in the order of (5+3 n) dBm (where n=0, 1, 2, . . . ) will be required for stabilising $2^n$ lasers (N.B. loss of 3 dBm at each splitting level). A noise signal having a power of 18 dBm for stabilising 64 is quite certainly achievable.

What is claimed is:

1. Optical system configured to generate and transmit a stabilized optical transmission signal, comprising:

an optical transmission line;

a first signal source connected to said optical transmission line and including a first laser having a number of separate laser modes having laser wavelengths within a first wavelength band containing the gain curve of the first laser, said first signal source being configured to generate and transmit an optical transmission signal over said optical transmission line;

an optical connection;

a second signal source configured to generate an optical injection signal, said second signal source being coupled to the first signal source via the optical connection coupled to the first laser, wherein the second signal source contains an optical noise source configured to generate a narrow-band noise signal having wavelengths within a second wavelength band so as to be included with the optical injection signal in a manner such that the second wavelength band of the noise signal lies within the first wavelength band of the first laser, and that the first laser has at least one laser mode having a laser wavelength within the second wavelength band, and further wherein the first laser operates or is forced to operate in said at least one laser mode having a wavelength within the second wavelength band.

2. The optical system according to claim 1, further comprising an optical coupling device coupled with said optical transmission line and configured to insert the optical injection signal into the optical transmission line in the direction of the first signal source.

3. The optical system according to claim 2, further comprising:
   at least one further signal source of a same kind as the first signal source;
   an optical splitting device coupling a further optical transmission line to said optical transmission line;
   wherein the second signal source is also coupled to said further signal source via the further optical transmission line and splitting device for injecting the optical injection signal into a further laser of the further signal source.

4. The optical system according to any one of claims 1, 2 or 3, further comprising:
   an optical narrow-band filter having a pass band for the second wavelength band of the narrow-band noise signal provided in the transmission line upstream of the optical coupling device.

5. The optical system according to any one of claims 1, 2, or 3 wherein the first laser is a semiconductor laser.

6. The optical system according to claim 5, wherein the first laser is an FP-type laser.

7. The optical system according to any one of claims 2 or 3, wherein the optical noise source and the optical coupling device are formed by a bidirectional optical amplifier which is included in the optical transmission line.

8. A optical signal transmission system comprising:
   a main station;
   a group of network terminals, each terminal having an optical signal source including a laser and configured to generate and transmit an optical transmission signal;
   a passive optical network provided between the optical signal source of each network terminal and the main station,
   wherein first sub-group lasers of at least a first sub-group of the group of network terminals each have a number of separate laser modes having laser wavelengths within a common first wavelength band, said common first wavelength band containing the gain curve of each first sub-group laser so as to form a transmission band, and wherein the optical system further comprises,
   a first noise source for generating a first noise signal having wavelengths within a second wavelength band, said second wavelength band being a noise band, and
   an insertion device included in the passive optical network at a main extremity of a part of the optical network branching in a tree-shape manner forming a first sub-tree, said insertion device being configured to insert and distribute at least a part of the first noise signal in the first sub-tree, said first sub-tree connecting the main extremity to said first sub-group of network terminals, and
   wherein the noise band lies within the transmission band of each laser of the first sub-group, and further wherein the first noise signal distributed in the first sub-tree is injected into the first sub-group lasers to stabilize the first sub-group lasers at a wavelength within the noise band.

9. The optical signal transmission system according to claim 8, wherein the noise source is configured as a narrow-band noise source so as to generate a narrow-band noise signal.

10. The optical signal transmission system according to claim 9, wherein further sub-group lasers of a further sub-group of the group of network terminals are provided with the further sub-group lasers being of a same type as the first sub-group lasers, and the optical signal transmission system further comprises,
   a further noise source of a same kind as the first noise source and configured to generate a further narrow-band noise signal having wavelengths within a further noise band, and
   further insertion devices included in the passive optical network at a further main extremity of a further sub-tree of the optical network, said further insertion devices being configured to insert and distribute said further narrow-band noise signal in the further sub-tree,
   wherein the further narrow-band noise signal is injected into further lasers of the further sub-group of network terminals connected to the further sub-tree for stabilizing the further lasers at a wavelength within the further noise band.

11. The optical signal transmission system according to claims 9 or 10, wherein the passive optical network upstream from the insertion device and/or the further insertion devices includes an optical narrow band filter having a pass band for the noise band and the further noise band, respectively.

12. The optical signal transmission system according to claim 11, wherein the passive optical network upstream from the insertion device and/or the further insertion devices preceding the related narrow-band filter includes an optical signal amplifier.

13. The optical signal transmission system according to claim 8, wherein the passive optical network comprises one or more further sub-trees to which one or more further sub-groups of network terminals are connected, and each one or more further sub-groups are provided with lasers of a same type as the lasers of the first sub-group,
   and further wherein between the insertion device and the main extremity of the first sub-group a WDM router is included, said WDM router being provided with 1×M bidirectional ports for spectral slicing of signals which are applied to the single port in the one signal transport direction, and multiplexing of the signals which are applied to the remaining M ports in the other signal direction, such that the first and each further sub-tree of the optical network is connected to a main extremity and another of the M ports of the WDM router, wherein the noise signal applied to the WDM router via the insertion devices are divided due to the spectral slicing effect of the WDM router into sliced noise signals having mutually disjoint noise sub-bands, said mutually disjoint noise sub-bands being distributed in a sub-tree which varies per mutually disjoint noise sub-band, and configured to be injected into lasers of the sub-group of the network terminals connected to the related sub-tree for stabilizing the lasers of the related sub-tree at a wavelength within the related mutually disjoint noise sub-band.

14. The optical signal transmission system according to any one of claims 8, 9, 10, or 13, wherein the lasers in each of the network terminals are semiconductor FP lasers.

15. The optical signal transmission system according to any one of claims 8, 9, 10, or 13, wherein the noise source and/or further noise source in combination with the related insertion device has the configuration of a bidirectional optical amplifier included in the passive optical network at the location of the related insertion device.

16. The optical system according to claim 4, wherein the first laser is a semiconductor laser.

17. The optical system according to claim 16, wherein the semiconductor laser is an FP semiconductor laser.

18. The optical signal transmission system according to claim 11, wherein the lasers in network terminals are semiconductor FP lasers.

19. The optical signal transmission system according to claim 11, wherein the noise source and/or further noise source in combination with the related insertion device has the configuration of a bidirectional optical amplifier and is included in the passive optical network at the location of the related insertion device.

20. The optical signal transmission system according to claim 14, wherein the noise source and/or further noise source in combination with the related insertion device has the configuration of a bidirectional optical amplifier and is included in the passive optical network at the location of the related insertion device.

* * * * *